(12) United States Patent
Gu et al.

(10) Patent No.: US 12,625,186 B2
(45) Date of Patent: May 12, 2026

(54) METHOD AND SYSTEM FOR TARGET-BASED ELECTRIC FIELD DECOUPLING FOR ELECTROCHEMICAL MODEL

(71) Applicant: Makesense Energy Technology Co., Limited., Shanghai (CN)

(72) Inventors: Danfei Gu, Shanghai (CN); Siyuan Chen, Shanghai (CN); Mingchen Jiang, Shanghai (CN); Xiao Yan, Shanghai (CN); Enhai Zhao, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 368 days.

(21) Appl. No.: 18/208,392

(22) Filed: Jun. 12, 2023

(65) Prior Publication Data

US 2024/0003978 A1 Jan. 4, 2024

(30) Foreign Application Priority Data

Jun. 29, 2022 (CN) .......................... 202210752376.2

(51) Int. Cl.
*G01R 31/367* (2019.01)
*G01R 31/385* (2019.01)
*G01R 31/392* (2019.01)

(52) U.S. Cl.
CPC ......... *G01R 31/367* (2019.01); *G01R 31/385* (2019.01); *G01R 31/392* (2019.01)

(58) Field of Classification Search
CPC .. G01R 31/367; G01R 31/385; G01R 31/392; H01M 10/0525; H01M 10/48; G16C 10/00; G16C 20/10
See application file for complete search history.

(56) References Cited

U.S. PATENT DOCUMENTS 8,901,892 B2 * 12/2014 Yazami ................. H01M 10/48
320/152

FOREIGN PATENT DOCUMENTS

CN 109839599 A * 6/2019 .......... G01R 31/388

* cited by examiner

*Primary Examiner* — Tung S Lau
(74) *Attorney, Agent, or Firm* — troutman pepper locke; Tim Tingkang Xia, Esq.

(57) ABSTRACT

The invention discloses method and system for target-based electric field decoupling for an electrochemical model. The method includes selecting one endpoint of a negative/positive electrode region as a starting point and the other endpoint as an end point; providing a trial solution of solid-phase and liquid-phase potentials of the starting point empirically, obtaining solid-phase/liquid-phase current of the end point according to the trial solution; obtaining a tentative solution that satisfies boundary value conditions by iterative approximation; designating the tentative solution satisfying the boundary value conditions as a deterministic solution of the solid phase potential and the liquid phase potential of the starting point; and obtaining the microscopic physical quantity of any spatial point in the positive electrode region/negative electrode region in the electric field based on the deterministic solution of the solid phase/liquid phase current, the solid phase and liquid phase potentials at the starting point.

9 Claims, 2 Drawing Sheets

METHOD AND SYSTEM FOR TARGET-BASED ELECTRIC FIELD DECOUPLING FOR ELECTROCHEMICAL MODEL

CROSS-REFERENCE TO RELATED PATENT APPLICATION

This application claims priority to and the benefit of Chinese Patent Application No. 202210752376.2, filed Jun. 29, 2022, which are incorporated herein in their entireties by reference.

FIELD OF THE INVENTION

The invention relates generally the field of batteries, and more particularly to a method and a system for target-based electric field decoupling for an electrochemical model of a lithium ion battery.

BACKGROUND OF THE INVENTION

Lithium-ion batteries are a new generation of secondary batteries, with high energy density and cycle life, and are widely used in mobile communications, digital technology, electric vehicles, energy storage and other fields.

By establishing electrochemical models for lithium-ion batteries, the simulated values of various microscopic physical quantities in the internal space and time of the battery can be obtained, which can more clearly understand and monitor the real-time working status of lithium-ion batteries.

In the electrochemical models, the transformation of most microscopic physical quantities with time and space is described by time-domain partial differential equations. On one hand, these partial differential equations are described in both time and space, and attention needs to be paid to the separation of time and space. On the other hand, multiple partial differential equations are strongly coupled to each other, and decoupling is required when performing numerical simulations.

The electrochemical pseudo-two-dimensional (P2D) coupling model is a full-order electrochemical model, and its equation describes only one dimension in the Euclidean space, and meanwhile, the radial dimension of the active material particles is wound everywhere in the one-dimensional Euclidean space. In these two spatial dimensions, multiple fields such as an electric field, a thermal field, and a stress field are coupled each other to describe various physical and chemical processes such as electrochemistry, mass transfer, heat transfer, and momentum transfer, and various phases and subphases such as particles, solids, liquids, metals, and polymers, which are very complex.

In the electric field of the full-order electrochemical model, there are two kinds of carriers, lithium ions and electrons, and the internal state physical quantities include solid-phase ion concentration, liquid-phase ion concentration, solid-phase current, liquid-phase current, solid-liquid two-phase exchange current density, solid phase potential, liquid phase potential, and the likes. Each of these quantities is coupled to the other quantities. The coupling means that the change of the physical quantity X causes the change of the physical quantity Y, which in turns causes the change of the physical quantity X, until the real-time dynamic balance is reached.

With respect to the solution of an electrochemical model, on the one hand, the internal state solution of the single field or single phase is relatively mature, including, but is not limited to, the single field solution of the temperature field, the solution of the solid phase or liquid phase concentration of the lithium ion concentrations.

The current solution technology does not involve the solution of multi-field and multi-phase coupled physical fields. The solution is to simplify and reduce the order of the model, so that the coupling between fields and phases is weakened or eliminated, and then obtain the solution of a plurality of single fields or single phases. However, such solution inevitably has loss, and cannot simulate and reflect the real internal state of the battery. On the other hand, the mathematical systems of the temperature field and the concentration field are linear systems, and its solution difficulty is relatively low. However, the physical response of the electric field of the battery is a less suitable nonlinear system, and multi-field and multi-phase exist in the electric field, so that no good solution exists for electric field decoupling in a full-order electrochemical model.

Therefore, a heretofore unaddressed need exists in the art to address the aforementioned deficiencies and inadequacies.

SUMMARY OF THE INVENTION

In view of the above-noted shortcomings, one of the objectives of this invention is to provide a method and a system for target-based electric field decoupling for an electrochemical model of a lithium ion battery to solve the electric field decoupling problems of the electrochemical reaction process in a lithium ion battery full-order electrochemical model in the prior art.

In one aspect of the invention, the method includes selecting a negative electrode region or a positive electrode region of the electrochemical model of the lithium ion battery as a calculation region, and marking one endpoint of the calculation region as a starting point and the other endpoint as an end point; selecting a solid phase current or a liquid phase current as an observed quantity; acquiring the observed quantity of the starting point at a present time; initializing a solid-phase potential and a liquid-phase potential of the starting point at the present time by using a trial solution; based on the observed quantity, the solid-phase potential and the liquid-phase potential of the starting point at the present time, obtaining the observed quantity of the end point at the present time according to an electrochemical reaction process of the electrochemical model; determining whether an error between the observed quantity of the end point at the present time and a target value of the end point is within an error range; when the error is not within the error range, updating the trial solution according to a preset rule, initializing the solid-phase potential and the liquid-phase potential of the starting point at the present time by using a new trial solution, obtaining the observed quantity of the end point at the present time according to the new trial solution, determining whether the error between the observed quantity of the end point at the present time and the target value of the observed quantity is within the error range, and repeating the process until the error is within the error range; when the error is within the error range, using the trial solution as a deterministic solution of the solid-phase potential and the liquid-phase potential of the starting point at the present time; and obtaining microscopic physical quantities of each spatial point in the calculation region at the present time according to the observed quantity of the starting point at the present time and the deterministic solution of the solid-phase potential and the liquid-phase potential of the starting point at the present time.

In one embodiment, when the starting point is an endpoint proximal to a current collector, the solid-phase current of the starting point at the present time is equal to an external current at the present time, and the target value of the solid-phase current of the end point at the present time is 0; and when the starting point is an endpoint distal to the current collector, the solid phase current of the starting point at the present time is equal to 0, and the target value of the solid phase current of the end point at the present time is the external current at the present time.

In one embodiment, said initializing the solid-phase potential and the liquid-phase potential of the starting point at the present time by using the trial solution comprises initializing the solid-phase potential of the starting point at the present time to the deterministic solution of the solid-phase potential of the starting point at a previous time, and initializing the liquid-phase potential of the starting point at the present time to the deterministic solution of the liquid-phase potential of the starting point at the previous time.

In one embodiment, said obtaining the observed quantity of the end point at the present time based on the observed quantity, the solid-phase potential and the liquid-phase potential of the starting point at the present time comprises based on the observed quantity, the solid-phase potential and the liquid-phase potential of the starting point at the present time, calculating the observed quantity, the solid-phase potential and the liquid-phase potential of a next spatial point at the present time along the x axis at a preset pace; and calculating the observed quantity, the solid-phase potential and the liquid-phase potential of another next spatial point at the present time according to the observed quantity, the solid-phase potential and the liquid-phase potential of the next spatial point at the present time, and repeating the processes until the observed quantity, the solid-phase potential and the liquid-phase potential of the end point at the present time are obtained.

In one embodiment, said calculating the observed quantity, the solid-phase potential and the liquid-phase potential of the next spatial point at the present time based on the observed quantity, the solid-phase potential and the liquid-phase potential of the starting point comprises:

based on the solid phase potential and the liquid phase potential of the starting point at the present time, obtaining an overpotential of the starting point at the present time by a formula of:

$$\eta(x,t) = \phi_s(x,t) - \phi_e(x,t) - ocv(x,t);$$

wherein $\eta$ is the overpotential, $\phi_s$ is the solid phase potential, $\phi_e$ is the liquid phase potential, ocv is an electrode steady state open circuit voltage related to a lithium ion concentration on surfaces of solid phase particles;

based on the overpotential of the starting point at the present time, obtaining an exchange current density of the starting point at the present time by a formula of:

$$j_n(x, t) = \frac{1}{F} j_0(x, t) \left[ \exp\left( \frac{\alpha^+ F}{RT} \eta(x, t) \right) - \exp\left( -\frac{\alpha^- F}{RT} \eta(x, t) \right) \right];$$

wherein $\alpha^+$ and $\alpha^-$ are transfer coefficients, F is a Faraday constant, R is a molar gas constant, T is an absolute temperature of the battery, and $j_0$ is the exchanging current density for an electrode reaction in an equilibrium state; based on the exchange current density of the starting point at the present time, calculating the observed quantity of the next spatial point at the present time by using a difference method or a Runge-Kutta method;

based on the observed quantity of the starting point at the present time, obtaining a partial derivative of the solid-phase potential of the starting point at the present time by a formula of:

$$\frac{\partial \phi_s}{\partial x}(x, t) = -\frac{i_s(x, t)}{k}$$

wherein $i_s$ is the solid phase current, k is a solid phase conductivity; calculating the solid phase potential of the next spatial point by using the difference method or the Runge-Kutta method based on the partial derivative of the solid phase potential of the starting point at the present time;

obtaining a partial derivative of the liquid phase potential of the starting point at the present time according to a formula of:

$$\frac{\partial \phi_e}{\partial x}(x, t) = -\frac{i_e(x, t)}{\sigma * \varepsilon^{brug}} + \frac{2RT}{F}(1 - t_c)\frac{\partial \ln c_e}{\partial x}(x, t)$$

wherein $i_e$ is the liquid phase current, $t_c$ is the point mobility, $c_e$ is a liquid phase lithium ion concentration, $\sigma$ is a liquid phase conductivity, $\varepsilon$ is a liquid phase volume fraction, brug is a porous media coefficient; and calculating the liquid phase potential of the next spatial point by using the difference method or the Runge-Kutta method based on the partial derivative of the liquid phase potential of the starting point at the present time.

In one embodiment, said updating the trial solution according to the preset rule comprises:

$$x_{k+1} = x_k + \frac{g - i_k}{i_k - i_{k-1}}(x_k - x_{k-1})$$

wherein $x_k$ is the kth trial solution, $i_k$ is the observed quantity of the end point at the present time obtained by adopting the kth trial solution, and g is the target value of the observed quantity of the end point at the present time.

In one embodiment, after said obtaining microscopic physical quantities of each spatial point in the calculation region at the present time, the method further comprises performing an early warning diagnosis on the lithium ion battery according to the microscopic physical quantities.

In one embodiment, the microscopic physical quantities include the overpotential; and said performing the early warning diagnosis on the lithium ion battery based on the microscopic physical quantities comprises when the overpotential of at least one spatial point is smaller than a first potential threshold value, the lithium ion battery is considered to have SEI film thickening; when the overpotential of at least one spatial point is smaller than a second potential threshold, the lithium ion battery is considered to have lithium dendrite growth; and when the overpotential of at least one spatial point is higher than a third potential threshold, the lithium ion battery is considered to be decomposed by an electrolyte.

In one embodiment, the microscopic physical quantities include the liquid phase current; and said performing the early warning diagnosis on the lithium ion battery based on the microscopic physical quantities comprises when the liquid phase current of at least one spatial point is higher than a first current threshold, the lithium ion battery is considered to have an internal short circuit.

In another aspect, the invention relates to a system for target-based electric field decoupling for an electrochemical model of a lithium ion battery, wherein a negative electrode region or a positive electrode region of the electrochemical model of the lithium ion battery is selected as a calculation region, and one endpoint of the calculation region is marked as a starting point and the other endpoint is marked as an end point, and a solid phase current or a liquid phase current is selected as an observed quantity.

The system comprises an acquisition module, configured to acquire the observed quantity of the starting point at a present time; a setting module, configured to initialize a solid-phase potential and a liquid-phase potential of the starting point at the present time by using a trial solution; and a calculation module configured to:

obtain the observed quantity of the end point at the present time according to the observed quantity, the solid-phase potential and the liquid-phase potential of the starting point at the present time and the electrochemical reaction process of the electrochemical model;

determine whether an error between the observed quantity of the end point at the present time and a target value of the end point is within an error range;

when the error is not within the error range, update the trial solution according to a preset rule, initializing the solid-phase potential and the liquid-phase potential of the starting point at the present time by using a new trial solution, obtain the observed quantity of the end point at the present time according to the new trial solution, determine whether the error between the observed quantity of the end point at the present time and the target value of the observed quantity is within the error range, and repeat the process until the error is within the error range; and when the error is within the error range, the trial solution is used as a deterministic solution of the solid-phase potential and the liquid-phase potential of the starting point at the present time.

The system also comprises a microscopic quantity updating module, configured to obtain the microscopic physical quantities of each spatial point in the calculation region at the present time according to the observed quantity of the starting point at the present time and the deterministic solution of the solid-phase potential and the liquid-phase potential of the starting point at the present time.

The method and system for target-based electric field decoupling for an electrochemical model of a lithium ion battery according to embodiments of the invention have at least one of the following technical effects.

1. The invention converts the solution of the partial differential equations describing changes of the electric fields into the boundary value problem with boundary conditions at two ends, and realizes the electric field decoupling of the full-order electrochemical model by a targeting method.

2. The electric field decoupling method of the invention consumes less storage resources, has fast operation speed, and is suitable for hardware implementation.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

DETAILED DESCRIPTION OF THE INVENTION

Figure 1:
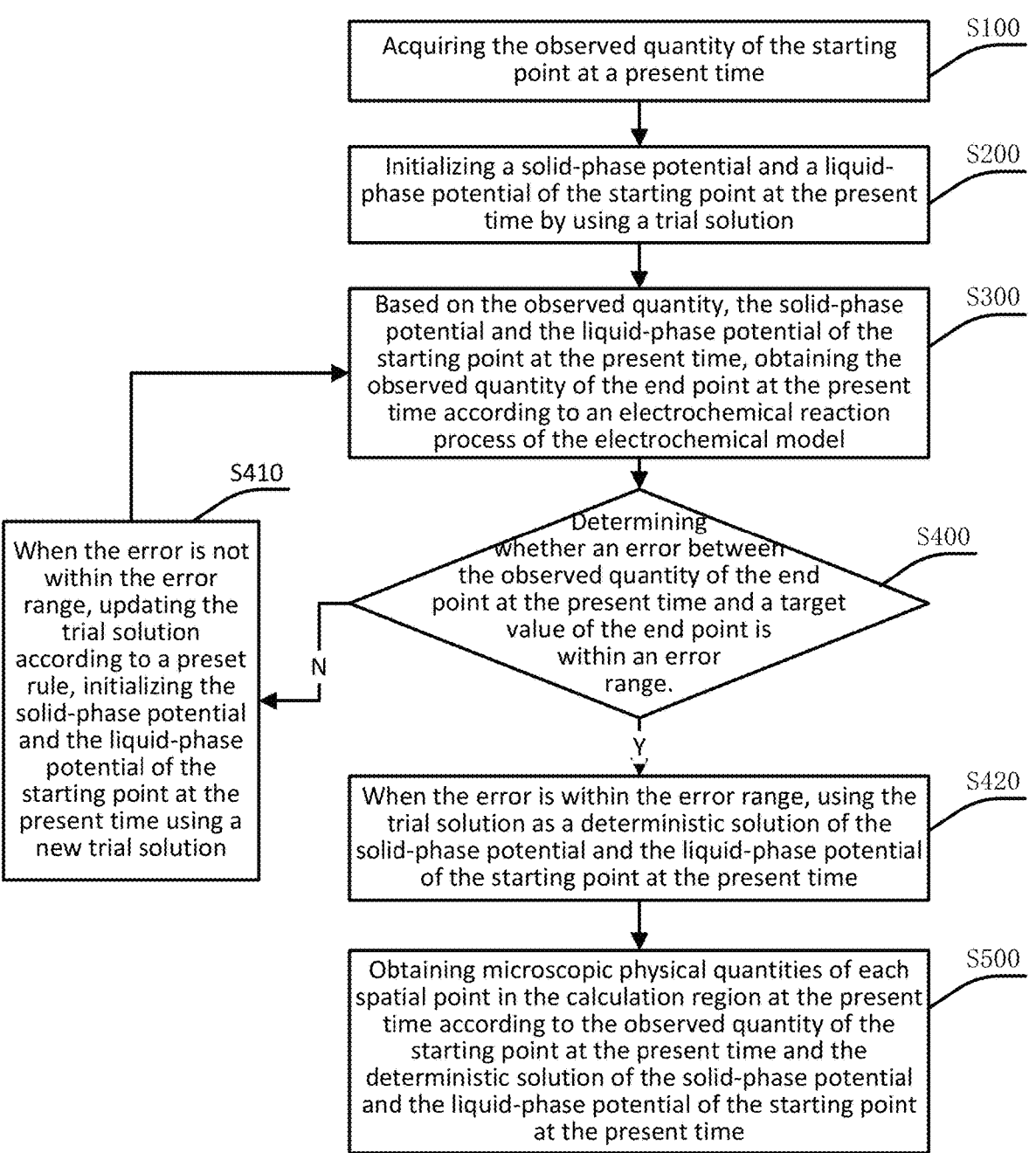
FIG. 1 shows schematically a flowchart of one embodiment of a method for target-based electric field decoupling for an electrochemical model according to one embodiment of the invention.

In the following description, for purposes of explanation and not limitation, specific details are set forth, such as particular system configurations, techniques, etc. in order to provide a thorough understanding of the embodiments of the invention. However, it will be apparent to one skilled in the art that the invention may be practiced in other embodiments that depart from these specific details. In other instances, detailed descriptions of well-known systems, devices, circuits, and methods are omitted so as not to obscure the description of the invention with unnecessary detail.

It should be understood that the terms "comprises" and/or "comprising", or "includes" and/or "including", or "has" and/or "having", or "carry" and/or "carrying", or "contain" and/or "containing", or "characterized by", and the like are to be open-ended, i.e., to mean including but not limited to. When used in this disclosure, they specify the presence of stated features, regions, integers, steps, operations, elements, and/or components, but do not preclude the presence or addition of one or more other features, regions, integers, steps, operations, elements, components, and/or groups thereof.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. For components with the same structure or function in some figures, only one of them is schematically shown, or only one of them is marked. They do not represent the actual structure of the product. Dimensional drawing, the type, quantity and proportion of each component can be changed arbitrarily in its actual implementations. More complicate component layouts may also become apparent in view of the drawings, the specification, and the following claims.

It should be understood that, as used in the description herein and throughout the claims that follow, the meaning of "a", "an", and "the" includes plural reference unless the context clearly dictates otherwise. The term "and/or" as used in this specification and the appended claims refers to any and all possible combinations of one or more of the associated listed items, and includes such combinations.

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

In order to more clearly illustrate the embodiments of the invention or the technical solutions in the prior art, the following description will explain the specific embodiments of the invention with reference to the accompanying drawings. It is evident that the drawings in the following description are only examples of the invention, from which other drawings and other embodiments can be obtained by a person skilled in the art without inventive effort.

As described above, the full-order electrochemical model of the lithium ion battery involves a large number of physical quantities, and the physical quantities are coupled with each other, which is particularly prominent in the electric field of the electrochemical model.

The current changes and potential changes in the electric field are strongly coupled to each other. However, since the response speed of the electric field is much faster than that of the density field, for each time scale of the density field, the electric field is in a (pseudo-) equilibrium state. The electric field decoupling is to obtain the microscopic physical quantity of the electric field corresponding to the time scale of each density field, that is, the microscopic physical quantity of each spatial point when the electric field is in equilibrium.

It is known that the changes in current, potential, etc. along the space are described by partial differential equations, which need to be solved for the solution of the current and potential.

Based on the fact that solid phase current and liquid phase current of two endpoints of the positive region/negative region are definite, the method converts the solution of the partial differential equations into a boundary value problem with boundary conditions at both ends, and solves the boundary value problem by adopting a targeting method.

Specifically, one endpoint of the negative electrode region/the positive electrode region is selected as a starting point, the other endpoint is selected as an end point, and an initial trial solution of the solid-phase potential and the liquid-phase potential of the starting point can be provided empirically. According to the initial trial solution, the solid-phase current/liquid-phase current of the end point is obtained. Then the trial solution is adjusted to obtain a trial (tentative) solution meeting the boundary value condition (that is, the error between the solid-phase current/liquid-phase current of the end point and the target value needs to be controlled within an error range) by an iterative approximation method. When a trial solution satisfying the boundary condition is found, the trial (tentative) solution is designated/taken as a deterministic solution of the solid-phase potential and the liquid-phase potential of the starting point. Then, according to the deterministic solution of the solid phase/liquid phase current, the solid phase potential and the liquid phase potential of the starting point, the microscopic physical quantity of any spatial point of the positive electrode region/the negative electrode region in the electric field can be obtained.

The electric field decoupling method provided by the invention consumes less storage resources and has a fast operation speed, and is suitable for realization by hardware (such as FPGA, ASIC, DSP and other special processors).

The embodiments of the invention are described in detail below by taking a pseudo-two-dimensional (P2D) model of a lithium-ion battery as an example.

In one embodiment, as shown in FIG. 1, the method for target-based electric field decoupling for the electrochemical model includes the P2D model.

Figure 3:
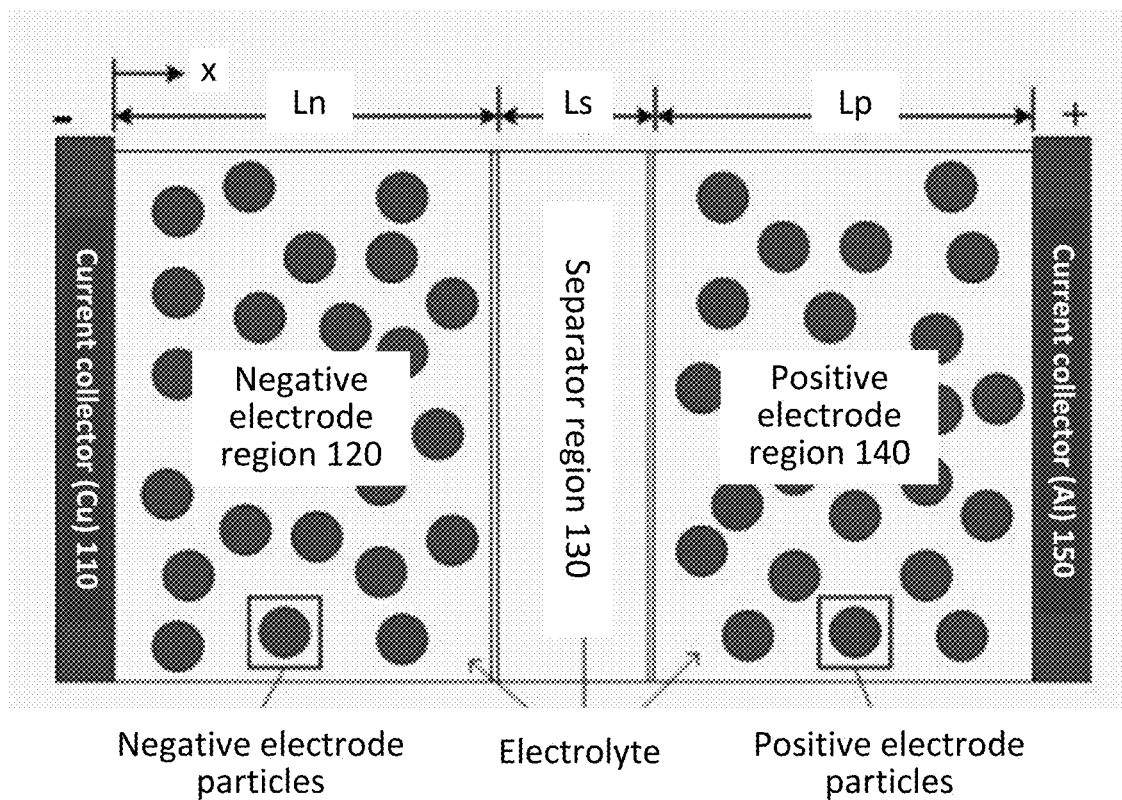
FIG. 3 shows schematically a structural diagram of a P2D model of a lithium ion battery according to one embodiment of the invention.

The schematic structure of the P2D model is shown in FIG. 3. The basic units of the lithium ion battery are respectively a copper current collector 110, a negative electrode 120, a separator 130, a positive electrode 140 and an aluminum current collector 150. From the perspective of spatial distribution, a lithium ion battery 110 can be divided into three domains/regions, that is, a negative electrode region 120, a separator region 130, and a positive electrode region 140. The width of the positive electrode region is Lp, the width of the negative electrode region is Ln, and the width of the separator region is Ls.

In some embodiments, a plane coordinate system is established for the battery, and the x-axis is established along the direction from the negative electrode 130 to the positive electrode 150 in the embodiments. It can also be reversed in other embodiments, and there is no limitation to this establishment.

In one embodiment, a negative electrode region or a positive electrode region is selected as a calculation region. The calculation region has two endpoints, one of which is designated as a start point and the other as an end point.

As shown in FIG. 3, one endpoint of the negative electrode region 120 is proximal to the first current collector 110, i.e., copper current collector (Cu), and the other endpoint is distal to the first current collector 110 and close to the separator region 130. One endpoint of the positive electrode region 140 is proximal to the second current collector 150, i.e., aluminum current collector (Al), and the other endpoint is distal to the second current collector 150 and close to the separator region 130.

In one embodiment, either a solid phase current or a liquid phase current is selected as the observed quantity.

The method further includes the following steps of S100 to S600.

At step S100, acquiring the observed quantity of the starting point at a present time.

At step S200, initializing a solid-phase potential and a liquid-phase potential of the starting point at the present time by using a trial solution.

At step S300, based on the observed quantity, the solid-phase potential and the liquid-phase potential of the starting point at the present time, obtaining the observed quantity of the end point at the present time according to an electrochemical reaction process of the electrochemical model.

At step S400, determining whether an error between the observed quantity of the end point at the present time and a target value of the end point is within an error range.

At step S410, when the error is not within the error range, updating the trial solution according to a preset rule, initializing the solid-phase potential and the liquid-phase potential of the starting point at the present time using a new trial solution, and then going to step S300.

At step S420, when the error is within the error range, using the trial solution as a deterministic solution of the solid-phase potential and the liquid-phase potential of the starting point at the present time.

At step S500, obtaining microscopic physical quantities of each spatial point in the calculation region at the present time according to the observed quantity of the starting point at the present time and the deterministic solution of the solid-phase potential and the liquid-phase potential of the starting point at the present time.

Specifically, during the charging and discharging process of the battery, a current is generated. The current comprises a solid-phase current and a liquid-phase current. The solid-phase current refers to the current caused by movements of electrons, while the liquid-phase current refers to the current caused by movements of lithium ions in the electrolyte. The movement direction of the electrons is opposite to that of external current, and the movement direction of the lithium ions is the same as that of the external current. The sum of the solid phase current and the liquid phase current of any spatial point is equal to the external current.

In the calculation region, regardless of the positive electrode area or the negative electrode area, the solid-phase current/liquid-phase current at its two endpoints is determined and known, but the solid-phase potential and liquid-phase potential are not determined When the starting point is an endpoint proximal to a current collector, the solid-phase current of the starting point at the present time is equal to an external current at the present time, and the liquid-phase current of the starting point at the present time is 0. The target value of the solid phase current at the end point at the present time is 0, and the target value of the liquid phase current at the end point at the present time is the external current.

When the starting point is an endpoint distal to the current collector, the solid phase current of the starting point at the present time is equal to 0, and the liquid phase current of the starting point at the present time is the external current. The target value of the solid phase current of the end point at the present time is the external current at the present time, and the target value of the liquid phase current of the end point at the present time is 0.

The trial solution is an uncertain solution, and the trial solution can be obtained by a simplified method or a reduced-order model in various ways.

By using a trial solution for the solid-phase potential and the liquid-phase potential of the starting point at the present time, the observed quantity, the solid-phase potential and the liquid-phase potential of the end point can be gradually calculated from the starting point according to various laws followed by the electrochemical reaction based on the observed quantity, the solid-phase potential and the liquid-phase potential of the starting point at the present time.

When the error between the observed value of the end point and the target value of the end point is within the error range, the currently used trial solution is the desired value, and the electric field decoupling is successful. The error range can be set according to the accuracy requirements.

When the error is not within the error range, further iterations are required to update the trial solution. For example, the (k+1)-th trial solution is obtained, and the observed quantity of the (k+1)-th end point is obtained according to the (k+1)-th trial solution. Whether the error between the observed quantity of the (k+1)-th end point and the target value is within the error range is determined, if yes, the (k+1)-th trial solution is the desired solution, and the decoupling is successful.

After obtaining the deterministic solution of the solid-phase potential and the liquid-phase potential of the starting point at the present time, according to the laws followed by the electrochemical reaction process, any microscopic physical quantity of any spatial point in the electric field can be obtained.

The electric field decoupling method of the negative electrode region is the same as that of the positive electrode region. Accordingly, the electric field decoupling can be performed on one region firstly, then the electric field decoupling is performed on the other region according to the same method, so as to complete the electric field decoupling of the entire space.

In the embodiment, the current change and the potential change caused by electrons of a solid phase are decoupled by using the target-based method. The current change and the potential change caused by lithium ions in a liquid phase are also decoupled on the assumption that the sum of the lithium ion current and the electron current at any spatial point in an electrochemical model is equal to the external current. Any microscopic physical quantity at any spatial point in the electric field is further obtained by determining the solid phase potential and the liquid phase potential at one end of the positive electrode region/negative electrode region at equilibrium. The embodiment realizes the electric field decoupling of the full-order electrochemical model.

In a preferred embodiment, the trial solution adopts the deterministic solution of the solid-phase potential at the previous time and the deterministic solution of the liquid-phase potential, that is, the solid-phase potential at the present time is initialized to the solid-phase potential at the previous time, and the liquid-phase potential at the present time is initialized to the liquid-phase potential at the previous time. Since the trial solution is relatively close to the real solution, the method is efficient to algorithm convergence and getting the deterministic solutions quickly.

In one embodiment, the solid-phase potential and the liquid-phase potential of the starting point at the initial time may be acquired by:

setting the liquid phase potential of the starting point at the initial time to be 0;

acquiring the solid-phase lithium ion concentration of the starting point at the initial time, calculating the ratio of the solid-phase lithium ion concentration of the starting point at the initial time to the maximum lithium ion concentration of the electrode material where the starting point is located, and marking the ratio as the solid-phase lithium ion concentration ratio of the starting point at the initial time; and obtaining the solid-phase potential of the starting point at the initial time according to the solid-phase lithium ion concentration ratio of the starting point at the initial time.

In one embodiment, step S300 includes:

step S310, based on the observed quantity, the solid-phase potential and the liquid-phase potential of the starting point at the present time, calculating the observed quantity, the solid-phase potential and the liquid-phase potential of a next spatial point at the present time along the x axis at a preset pace or step;

step S320, calculating the observed quantity, the solid-phase potential and the liquid-phase potential of another next spatial point at the present time according to the observed quantity, the solid-phase potential and the liquid-phase potential of the next spatial point at the present time, and repeating the processes until the observed quantity, the solid-phase potential and the liquid-phase potential of the end point at the present time are obtained.

In one embodiment, step S310 includes:

step S311, based on the solid phase potential and the liquid phase potential of the starting point at the present time, obtaining an overpotential of the starting point at the present time by a formula of:

$$\eta(x,t)=\phi_s(x,t)-\phi_e(x,t)-\text{ocv}(x,t);$$

wherein $\eta$ is the overpotential, $\phi_s$ is the solid phase potential, $\phi_e$ is the liquid phase potential, ocv is an electrode steady state open circuit voltage related to a lithium ion concentration on surfaces of solid phase particles, x represents a spatial point space, and t is the present time;

Step S312, based on the overpotential of the starting point at the present time, obtaining an exchange current density of the starting point at the present time by a formula of:

$$j_n(x, t) = \frac{1}{F} j_0(x, t) \left[ \exp\left( \frac{\alpha^+ F}{RT} \eta(x, t) \right) - \exp\left( -\frac{\alpha^- F}{RT} \eta(x, t) \right) \right];$$

wherein $\alpha^+$ and $\alpha^-$ are transfer coefficients, F is a Faraday constant, R is a molar gas constant, T is an absolute temperature of the battery, and $j_0$ is the exchanging current density for an electrode reaction in equilibrium;

Step S313, based on the exchange current density of the starting point at the present time, calculating the observed quantity of the next spatial point at the present time by using a difference method or a Runge-Kutta method;

The next space point is equal to the start point plus the preset pace/step. The exchange current density not only reflects the change of the lithium ion current per unit area, but also reflects the change of the electron current. The observed quantity is the solid-phase current or the liquid-phase current. Therefore, the observed quantity of the next spatial point can be obtained based on the observed quantity and the exchange current density of the starting point;

Step S314, obtaining the partial derivative of the solid-phase potential of the starting point at the present time according to the observed quantity of the starting point at the present time, and calculating the solid-phase potential of the next spatial point by using the difference method or the Runge-Kutta method according to the partial derivative of the solid-phase potential of the starting point at the present time.

If the observed quantity is the solid phase current, the partial derivative $$\frac{\partial \phi_s}{\partial x}$$

of the solid phase potential of the starting point at the present time is obtained according to the formula of:

$$\frac{\partial \phi_s}{\partial x}(x, t) = -\frac{i_s(x, t)}{k}$$

wherein $i_s$ is the solid phase current, k is a solid phase conductivity;

If the observed quantity is liquid phase current, obtaining the solid phase current of the starting point at the present time according to the formula of $$i_s(x,t)+i_e(x,t)=i_{external}(t)$$

wherein $i_{external}$ is the external current, then obtaining the partial derivative of the solid phase potential of the starting point at the present time according to the above formula;

by using the difference method or the Runge-Kutta method, the solid phase potential of the next spatial point is obtained based on the solid phase potential of the starting point and the partial derivative of the solid phase potential of the starting point at the present time;

Step S315, obtaining the partial derivative of the liquid phase potential of the starting point at the present time, and calculating the liquid phase potential of the next spatial point by using the difference method or the Runge-Kutta method based on the partial derivative of the liquid phase potential of the starting point at the present time.

Specifically, if the observed quantity is the solid phase current, liquid phase current of the starting point at the present time is obtained according to $$i_s(x,t)+i_e(x,t)=i_{external}(t);$$

then the partial derivative $$\frac{\partial \phi_e}{\partial x}$$

of the liquid phase potential of the starting point is obtained according to the formula of $$\frac{\partial \phi_e}{\partial x}(x, t) = -\frac{i_e(x, t)}{\sigma * \varepsilon^{brug}} + \frac{2RT}{F}(1 - t_c)\frac{\partial \ln c_e}{\partial x}(x, t)$$

wherein $i_e$ is the liquid phase current, $t_c$ is the point mobility, $c_e$ is a liquid phase lithium ion concentration, $\sigma$ is a liquid phase conductivity, $\varepsilon$ is a liquid phase volume fraction, brug is a porous media coefficient; and calculating to obtain the liquid phase potential of the next spatial point according to the liquid phase potential of the starting point and the partial derivative of the liquid phase potential.

In one embodiment, said updating the trial solution according to the preset rule comprises:

$$x_{k+1} = x_k + \frac{g - i_k}{i_k - i_{k-1}}(x_k - x_{k-1})$$

wherein $x_k$ is the kth trial solution, $i_k$ is the observed quantity of the end point at the present time obtained by adopting the k-th trial solution, and g is the target value of the observed quantity of the end point at the present time.

For example, if the observed quaintly is the solid-phase current and the end point is an endpoint distal to the current collector, the target value of the solid-phase current at the end point at the present time is 0, that is, g is 0.

In one embodiment, after obtaining microscopic physical quantities of each spatial point in the calculation region at the present time, the method further includes step S600, performing an early warning diagnosis on the lithium ion battery according to the microscopic physical quantities.

Since the microscopic physical quantities of the electrochemical model can more accurately describe the microscopic state inside the battery compared to the macroscopic state quantities of the battery (such as external current and voltage), these microscopic physical quantities can be used to diagnose the health status of the battery.

In addition, the electrochemical model is described by time-domain partial differential equations, it can predict the time trend of the microscopic physical quantities, so as to provide certain predictability and early warning of possible safety hazards.

In one embodiment, the microscopic physical quantities includes an overpotential. Step S600 includes:

when the overpotential of at least one spatial point is smaller than a first potential threshold value, early warning the lithium ion battery to have SEI (solid electrolyte interface) film thickening;

when the overpotential of at least one spatial point is smaller than a second potential threshold, early warning the lithium ion battery to have lithium dendrite growth; and when the overpotential of at least one spatial point is higher than a third potential threshold, early warning the lithium ion battery to have electrolyte decomposition.

In one embodiment, the microscopic physical quantity includes liquid phase current. Step S600 includes, when the liquid phase current of at least one spatial point is higher than a first current threshold, early warning the lithium ion battery to have an internal short circuit.

Specifically, during the electrochemical reaction, side reactions may occur, including, but not limited to, SEI film thickening, lithium dendrite growth, and electrolyte decomposition. The above microscopic physical quantities obtained by the electric field decoupling are used for early warning and diagnosis of the related side reactions.

Figure 2:
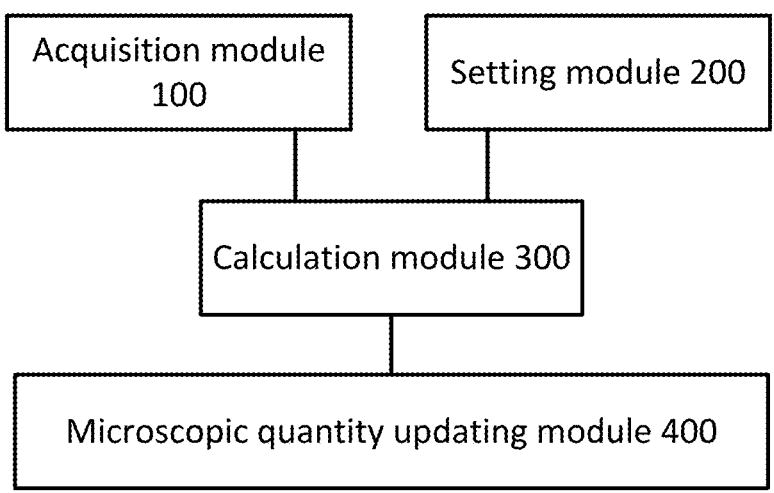
FIG. 2 shows schematically a structural diagram of a system for target-based electric field decoupling for an electrochemical model according to one embodiment of the invention.

Referring to FIG. 2, a system for target-based electric field decoupling for an electrochemical model of a lithium ion battery is shown according to one embodiment of the invention, wherein a negative electrode region or a positive electrode region of the electrochemical model of the lithium ion battery is selected as a calculation region, and one endpoint of the calculation region is marked as a starting point and the other endpoint is marked as an end point, and a solid phase current or a liquid phase current is selected as an observed quantity.

The system includes an acquisition module 100, a setting module 200, a calculation module 300, and a microscopic quantity updating module 400.

The acquisition module 100 is configured to acquire the observed quantity of the starting point at a present time.

The setting module 200 is configured to initialize a solid-phase potential and a liquid-phase potential of the starting point at the present time by using a trial solution.

The calculation module 300 is configured to obtain the observed quantity of the end point at the present time according to the observed quantity, the solid-phase potential and the liquid-phase potential of the starting point at the present time and the electrochemical reaction process of the electrochemical model;

determine whether an error between the observed quantity of the end point at the present time and a target value of the end point is within an error range;

when the error is not within the error range, update the trial solution according to a preset rule, initializing the solid-phase potential and the liquid-phase potential of the starting point at the present time by using a new trial solution, obtain the observed quantity of the end point at the present time according to the new trial solution, determine whether the error between the observed quantity of the end point at the present time and the target value of the observed quantity is within the error range, and repeat the process until the error is within the error range;

when the error is within the error range, the trial solution is used as a deterministic solution of the solid-phase potential and the liquid-phase potential of the starting point at the present time.

The microscopic quantity updating module 400 is configured to obtain the microscopic physical quantities of each spatial point in the calculation region at the present time according to the observed quantity of the starting point at the present time and the deterministic solution of the solid-phase potential and the liquid-phase potential of the starting point at the present time.

In one embodiment, the setting module 200 is further configured to initialize the solid-phase potential of the starting point at the present time to the deterministic solution of the solid-phase potential of the starting point at the previous time, and initialize the liquid-phase potential of the starting point at the present time to the deterministic solution of the liquid-phase potential of the starting point at the previous time.

In one embodiment, the setting module 200 is configured to further obtain the solid phase electric potential and the liquid phase electric potential at the initial time from the starting point by: setting the liquid phase potential of the starting point at the initial time to be 0; acquiring the solid-phase lithium ion concentration of the starting point at the initial time, calculating the ratio of the solid-phase lithium ion concentration of the starting point at the initial time to the maximum lithium ion concentration of the electrode material where the starting point is located, and marking the ratio as the solid-phase lithium ion concentration ratio of the starting point at the initial time; and obtaining the solid-phase potential of the starting point at the initial time according to the solid-phase lithium ion concentration ratio of the starting point at the initial time.

In one embodiment, the calculation module 300 is further configured to calculate the observed quantity, the solid-phase potential and the liquid-phase potential of the next spatial point at the present time along the x-axis in the preset pace/step according to the observed quantity, the solid-phase potential and the liquid-phase potential of the starting point; and calculating the observed quantity, the solid-phase potential and the liquid-phase potential of another next spatial point (which is the next of the next spatial point for example) at the present time according to the observed quantity, the solid-phase potential and the liquid-phase potential of the next spatial point at the present time, and repeating the processes until the observed quantity, the solid-phase potential and the liquid-phase potential of the end point at the present time are obtained.

In one embodiment, the calculation module 300 includes:

an overpotential calculation unit configured to obtain the overpotential of the starting point at the present time according to the solid-phase potential and the liquid-phase potential of the starting point at the present time;

an exchange current density calculation unit configured to obtain the exchange current density of the starting point at the present time according to the overpotential of the starting point at the present time;

a current calculating unit configured to calculate the observed quantity of the next spatial point at the present time by using the difference method or the Runge-Kutta method according to the observed quantity of the starting point at the present time and the exchange current density;

a potential calculating unit configured to obtain the partial derivative of the solid-phase potential of the starting point at the present time according to the observed quantity of the starting point at the present time, and calculating the solid-phase potential of the next spatial point by using the difference method or the Runge-Kutta method according to the partial derivative of the solid-phase potential of the starting point at the present time; and acquiring the partial derivative of the liquid phase potential of the starting point at the present time, and calculating the liquid phase potential of the next spatial point by using the difference method or the Runge-Kutta method according to the partial derivative of the liquid phase potential of the starting point at the present time;

a trial solution updating unit configured to update the trial solution according to the formula of:

$$x_{k+1} = x_k + \frac{g - i_k}{i_k - i_{k-1}}(x_k - x_{k-1})$$

wherein $x_k$ is the kth trial solution, $i_k$ is the observed quantity of the end point at the present time obtained by adopting the k-th trial solution, and g is the target value of the observed quantity of the end point at the present time; and an early warning diagnosis module configured to perform early warning diagnosis on the lithium ion battery according to the microscopic physical quantities.

In one embodiment, the early warning diagnostic module includes an overpotential early warning diagnosis unit configured to warn that the lithium ion battery has SEI film thickening when the overpotential of at least one spatial point is smaller than a first potential threshold value; the lithium ion battery has lithium dendrite growth when the overpotential of at least one spatial point is smaller than a second potential threshold; and the lithium ion battery has electrolyte decomposition when the overpotential of at least one spatial point is higher than a third potential threshold.

In one embodiment, the early warning diagnostic module includes a liquid phase current early warning diagnosis unit is configured to warn that that the lithium ion battery has an internal short circuit when the liquid phase current of at least one spatial point is higher than a first current threshold.

The embodiments of the system for target-based electric field decoupling for the electrochemical model provided by the invention and the embodiments of the method for target-based electric field decoupling for the electrochemical model provided by the invention are both based on the same inventive concept, and the same technical effects can be obtained. Therefore, other specific contents of the embodiment of the electric field decoupling system based on the electrochemical model of the targeting method can refer to the above description of the embodiment of the electric field decoupling method.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:

1. A method for target-based electric field decoupling for an electrochemical model of a lithium ion battery, comprising:

selecting a negative electrode region or a positive electrode region of the electrochemical model of the lithium ion battery as a calculation region, and marking one endpoint of the calculation region as a starting point and the other endpoint as an end point;

selecting a solid phase current or a liquid phase current as an observed quantity;

acquiring the observed quantity of the starting point at a present time;

initializing a solid-phase potential and a liquid-phase potential of the starting point at the present time by using a trial solution;

based on the observed quantity, the solid-phase potential and the liquid-phase potential of the starting point at the present time, obtaining the observed quantity of the end point at the present time according to an electrochemical reaction process of the electrochemical model;

determining whether an error between the observed quantity of the end point at the present time and a target value of the end point is within an error range;

when the error is not within the error range, updating the trial solution according to a preset rule, initializing the solid-phase potential and the liquid-phase potential of the starting point at the present time using another trial solution, obtaining the observed quantity of the end point at the present time according to said another trial solution, determining whether the error between the observed quantity of the end point at the present time and the target value of the observed quantity is within the error range, and repeating the process until the error is within the error range;

when the error is within the error range, using the trial solution as a deterministic solution of the solid-phase potential and the liquid-phase potential of the starting point at the present time; and obtaining microscopic physical quantities of each spatial point in the calculation region at the present time according to the observed quantity of the starting point at the present time and the deterministic solution of the solid-phase potential and the liquid-phase potential of the starting point at the present time, wherein said initializing the solid-phase potential and the liquid-phase potential of the starting point at the present time by using the trial solution comprises:

initializing the solid-phase potential of the starting point at the present time to the deterministic solution of the solid-phase potential of the starting point at a previous time, and initializing the liquid-phase potential of the starting point at the present time to the deterministic solution of the liquid-phase potential of the starting point at the previous time.

2. The method of claim 1, when the starting point is an endpoint proximal to a current collector, the solid-phase current of the starting point at the present time is equal to an external current at the present time, and the target value of the solid-phase current of the end point at the present time is 0;

when the starting point is an endpoint distal to the current collector, the solid phase current of the starting point at the present time is equal to 0, and the target value of the solid phase current of the end point at the present time is the external current at the present time.

3. The method of claim 1, wherein said obtaining the observed quantity of the end point at the present time based on the observed quantity, the solid-phase potential and the liquid-phase potential of the starting point at the present time comprises:

based on the observed quantity, the solid-phase potential and the liquid-phase potential of the starting point at the present time, calculating the observed quantity, the solid-phase potential and the liquid-phase potential of a next spatial point at the present time along the x axis at a preset pace; and calculating the observed quantity, the solid-phase potential and the liquid-phase potential of another next spatial point at the present time according to the observed quantity, the solid-phase potential and the liquid-phase potential of the next spatial point at the present time, and repeating the processes until the observed quantity, the solid-phase potential and the liquid-phase potential of the end point at the present time are obtained.

4. The method of claim 3, wherein said calculating the observed quantity, the solid-phase potential and the liquid-phase potential of the next spatial point at the present time based on the observed quantity, the solid-phase potential and the liquid-phase potential of the starting point comprises:

based on the solid phase potential and the liquid phase potential of the starting point at the present time, obtaining an overpotential of the starting point at the present time by a formula of:

$$\eta(x,t) = \phi_s(x,t) - \phi_e(x,t) - ocv(x,t);$$

wherein $\eta$ is the overpotential, $\phi_s$ is the solid phase potential, $\phi_e$ is the liquid phase potential, ocv is an electrode steady state open circuit voltage related to a lithium ion concentration on surfaces of solid phase particles;

based on the overpotential of the starting point at the present time, obtaining an exchange current density of the starting point at the present time by a formula of:

$$j_n(x,t) = \frac{1}{F} j_0(x,t)\left[\exp\left(\frac{\alpha^+ F}{RT}\eta(x,t)\right) - \exp\left(-\frac{\alpha^- F}{RT}\eta(x,t)\right)\right];$$

wherein $\alpha^+$ and $\alpha^-$ are transfer coefficients, F is a Faraday constant, R is a molar gas constant, T is an absolute temperature of the battery, and $j_0$ is the exchanging current density for an electrode reaction in an equilibrium state;

based on the exchange current density of the starting point at the present time, calculating the observed quantity of the next spatial point at the present time by using a difference method or a Runge-Kutta method;

based on the observed quantity of the starting point at the present time, obtaining a partial derivative of the solid-phase potential of the starting point at the present time by a formula of:

$$\frac{\partial \phi_s}{\partial x}(x,t) = -\frac{i_s(x,t)}{k}$$

wherein $i_s$ is the solid phase current, k is a solid phase conductivity;

18 calculating the solid phase potential of the next spatial point by using the difference method or the Runge-Kutta method based on the partial derivative of the solid phase potential of the starting point at the present time;

obtaining a partial derivative of the liquid phase potential of the starting point at the present time according to a formula of:

$$\frac{\partial \phi_e}{\partial x}(x,t) = -\frac{i_e(x,t)}{\sigma * \varepsilon^{brug}} + \frac{2RT}{F}(1 - t_c)\frac{\partial \ln c_e}{\partial x}(x,t)$$

wherein $i_e$ is the liquid phase current, $t_c$ is the point mobility, $c_e$ is a liquid phase lithium ion concentration, $\sigma$ is a liquid phase conductivity, $\varepsilon$ is a liquid phase volume fraction, brug is a porous media coefficient; and calculating the liquid phase potential of the next spatial point by using the difference method or the Runge-Kutta method based on the partial derivative of the liquid phase potential of the starting point at the present time.

5. The method of claim 1, wherein said updating the trial solution according to the preset rule comprises:

$$x_{k+1} = x_k + \frac{g - i_k}{i_k - i_{k-1}}(x_k - x_{k-1})$$

wherein $x_k$ is the kth trial solution, $i_k$ is the observed quantity of the end point at the present time obtained by adopting the k-th trial solution, and g is the target value of the observed quantity of the end point at the present time.

6. The method of claim 1, wherein after said obtaining microscopic physical quantities of each spatial point in the calculation region at the present time, the method further comprises:

performing an early warning diagnosis on the lithium ion battery according to the microscopic physical quantities.

7. The method of claim 6, wherein the microscopic physical quantities include the overpotential; and wherein said performing the early warning diagnosis on the lithium ion battery based on the microscopic physical quantities comprises:

when the overpotential of at least one spatial point is smaller than a first potential threshold value, the lithium ion battery is considered to have SEI film thickening;

when the overpotential of at least one spatial point is smaller than a second potential threshold, the lithium ion battery is considered to have lithium dendrite growth; and when the overpotential of at least one spatial point is higher than a third potential threshold, the lithium ion battery is considered to have electrolyte decomposition.

8. The method of claim 6, wherein the microscopic physical quantities include the liquid phase current; and wherein said performing the early warning diagnosis on the lithium ion battery based on the microscopic physical quantities comprises when the liquid phase current of at least one spatial point is higher than a first current threshold, the lithium ion battery is considered to have an internal short circuit.

9. A system for target-based electric field decoupling for an electrochemical model of a lithium ion battery, wherein a negative electrode region or a positive electrode region of the electrochemical model of the lithium ion battery is selected as a calculation region, and one endpoint of the calculation region is marked as a starting point and the other endpoint is marked as an end point, and a solid phase current or a liquid phase current is selected as an observed quantity, the system comprising:

an acquisition module, configured to acquire the observed quantity of the starting point at a present time;

a setting module, configured to initialize a solid-phase potential and a liquid-phase potential of the starting point at the present time by using a trial solution, wherein said initializing the solid-phase potential and the liquid-phase potential of the starting point at the present time by using the trial solution comprises:

initializing the solid-phase potential of the starting point at the present time to the deterministic solution of the solid-phase potential of the starting point at a previous time, and initializing the liquid-phase potential of the starting point at the present time to the deterministic solution of the liquid-phase potential of the starting point at the previous time;

a calculation module configured to obtain the observed quantity of the end point at the present time according to the observed quantity, the solid-phase potential and the liquid-phase potential of the starting point at the present time and the electrochemical reaction process of the electrochemical model;

determine whether an error between the observed quantity of the end point at the present time and a target value of the end point is within an error range;

when the error is not within the error range, update the trial solution according to a preset rule, initializing the solid-phase potential and the liquid-phase potential of the starting point at the present time by using another trial solution, obtain the observed quantity of the end point at the present time according to said another trial solution, determine whether the error between the observed quantity of the end point at the present time and the target value of the observed quantity is within the error range, and repeat the process until the error is within the error range;

when the error is within the error range, the trial solution is used as a deterministic solution of the solid-phase potential and the liquid-phase potential of the starting point at the present time; and a microscopic quantity updating module, configured to obtain the microscopic physical quantities of each spatial point in the calculation region at the present time according to the observed quantity of the starting point at the present time and the deterministic solution of the solid-phase potential and the liquid-phase potential of the starting point at the present time.

* * * * *